United States Patent
Kim et al.

(10) Patent No.: US 12,250,823 B2
(45) Date of Patent: Mar. 11, 2025

(54) NON-VOLATILE MEMORY DEVICE AND ITS OPERATING METHOD

(71) Applicant: INDUSTRY-UNIVERSITY COOPERATION FOUNDATION HANYANG UNIVERSITY ERICA CAMPUS, Ansan-si (KR)

(72) Inventors: Younghyun Kim, Seoul (KR); Seongui An, Ansan-si (KR); Taewon Jin, Uijeongbu-si (KR); Taehyeon Noh, Yongin-si (KR); Simin Chen, Ansan-si (KR)

(73) Assignee: INDUSTRY-UNIVERSITY COOPERATION FOUNDATION HANYANG UNIVERSITY ERICA CAMPUS, Ansan-Si (KR)

( * ) Notice: Subject to any disclaimer, the term of this patent is extended or adjusted under 35 U.S.C. 154(b) by 0 days.

(21) Appl. No.: 18/541,812

(22) Filed: Dec. 15, 2023

(65) Prior Publication Data
US 2024/0206187 A1    Jun. 20, 2024

(30) Foreign Application Priority Data

Dec. 16, 2022  (KR) .......................... 10-2022-0176814
Dec. 14, 2023  (KR) .......................... 10-2023-0181567

(51) Int. Cl.
*G11C 11/22* (2006.01)
*H10B 51/30* (2023.01)
*H10B 51/40* (2023.01)

(52) U.S. Cl.
CPC ............ *H10B 51/30* (2023.02); *G11C 11/223* (2013.01); *G11C 11/2273* (2013.01); *G11C 11/2275* (2013.01); *H10B 51/40* (2023.02)

(58) Field of Classification Search
USPC ......................................................... 365/145
See application file for complete search history.

(56) References Cited

U.S. PATENT DOCUMENTS 5,737,261 A * 4/1998 Taira ...................... H10B 53/00
                                                        257/295
5,886,920 A * 3/1999 Marshall ................. G11C 11/22
                                                        365/145

(Continued)

FOREIGN PATENT DOCUMENTS

| KR | 10-2002-0020829 A | 3/2002 |
| KR | 10-2003-0065297 A | 8/2003 |
| KR | 10-2019-0082089 A | 7/2019 |

*Primary Examiner* — Tan T. Nguyen
(74) *Attorney, Agent, or Firm* — Finch & Maloney PLLC

(57) ABSTRACT

Disclosed herein are a non-volatile memory device and an operating method thereof. The non-volatile memory device includes a memory cell including a write transistor and a ferroelectric read transistor, a write word line connected to a gate terminal of the write transistor, a write bit line connected to a source terminal of the write transistor, a read word line connected to a source terminal of the ferroelectric read transistor, and a read bit line connected to a drain terminal of the ferroelectric read transistor, and a drain terminal of the write transistor may be connected to a gate terminal of the ferroelectric read transistor. According to the present invention, a low-power, high-density, and non-destructive dynamic random access memory (DRAM) can be implemented by realizing 2T0C FeDRAM based on a silicon complementary metal-oxide semiconductor (CMOS) process using a dielectric material.

16 Claims, 13 Drawing Sheets

(56) References Cited

U.S. PATENT DOCUMENTS

| | | |
|---|---|---|
| 6,404,667 B1 | 6/2002 | Yoo |
| 6,510,073 B1 | 1/2003 | Lee et al. |
| 2012/0134197 A1* | 5/2012 | Byun ..................... G11C 11/22 |
| | | 365/145 |
| 2019/0206474 A1 | 7/2019 | Van Houdt |

* cited by examiner (a)

| | Type | 1T-1C [1] | 2T [2] | AOS* 2T [3,4] | Nonvolatile 2T FeDRAM (This invention) |
|---|---|---|---|---|---|
| Embedded DRAM options | Circuit Schematic | Si Channel, BEOL Cap. | Si Channel | IWO Channel | ITZO Channel, Oxide TFT, FeFET |
| | Retention Time | 100~2000 μs | 100~1000 μs | 1~10 s | 10~160 yrs |
| | Access Time | 1~10 ns | 1~10 ns | 1~10 ns | 1~10 ns |
| | Destructive Read | Yes | No | No | No |
| | Density (Mb/mm²) | 10~30 | 1~10 | 80~200 | 80~200 |
| | Periphery | FEOL | FEOL | FEOL | FEOL |
| | Bit Cell | FEOL/BEOL | FEOL | BEOL | BEOL |

Program mode ($V_G > 0V$)
Programmed state

Program mode ($V_G < 0V$)
Floating Body
(W/O Top Gate)

Body Potential Fixed
(W/O Top Gate)

NON-VOLATILE MEMORY DEVICE AND ITS OPERATING METHOD

CROSS-REFERENCE TO RELATED APPLICATION

This application claims the benefit of Republic of Korea Patent Application 10-2022-0176814 (filed 16 Dec. 2022) and Republic of Korea Patent Application 10-2023-0181567 (filed 14 Dec. 2023). The entire disclosure of both of these priority applications is hereby incorporated by reference herein.

BACKGROUND

1. Field of the Invention

The present invention relates to a non-volatile memory device and an operating method thereof, and more specifically, to a non-volatile memory device using a ferroelectric material and an operating method thereof.

2. Discussion of Related Art

A dynamic random access memory (DRAM) has a simple structure and is easy to integrate, and thus it is used as a large-capacity temporary memory device. DRAMs form the mainstream of Korean semiconductor industry and are products that occupy a very large part of the semiconductor business.

Meanwhile, a DRAM has a problem of information destruction due to a physical overlap of read and write paths. For example, during a reading and writing process, because a portion where a voltage is applied and a portion where a current flows overlap and thus information is lost, a process of rewriting the information in a memory cell is necessary. This requires a non-destructive memory operation method.

In addition, a DRAM does not have a long retention time due to a limit of leakage current of a capacitor. Unlike a static random access memory (SRAM) or a flash memory, a phenomenon in which information stored in memory cells is lost over time (referred to as volatility) occurs in a DRAM. This is because a memory cell of a DRAM is formed of one transistor and one capacitor, and thus natural leakage of data stored in the capacitor occurs. Therefore, in order to prevent data loss, a refresh operation is performed to rewrite the information stored in the memory cell at regular intervals. The refresh operation may be performed by activating a word line in an active state at least once within a retention time of each memory cell to amplify data. The refresh operation consumes additional power.

Thus, in order to improve memory device performance, research is needed to enable non-destructive path implementation and increase a retention time.

SUMMARY OF THE INVENTION

The present invention is directed to providing a non-volatile memory technology that solves the shortcomings of the existing dynamic random access memory (DRAM), which inevitably has a low retention time and a destructive operation method, by implementing a non-destructive path and using a ferroelectric material.

Meanwhile, other unspecified objects of the present invention will be additionally considered within the scope that can be easily inferred from the following detailed description and an effect thereof.

According to an aspect of the present invention, there is provided a non-volatile memory device including a memory cell including a write transistor and a ferroelectric read transistor, a write word line connected to a gate terminal of the write transistor, a write bit line connected to a source terminal of the write transistor, a read word line connected to a source terminal of the ferroelectric read transistor, and a read bit line connected to a drain terminal of the ferroelectric read transistor, wherein a drain terminal of the write transistor is connected to a gate terminal of the ferroelectric read transistor.

The drain terminal of the write transistor may be connected to the gate terminal of the ferroelectric read transistor through a storage node and may induce a polarization direction in a ferroelectric material of the ferroelectric read transistor while the write transistor is turned on.

The ferroelectric material may be hafnium-zirconium oxide.

The memory cell may be formed on a silicon complementary metal-oxide semiconductor (CMOS) logic integrated circuit through a front end of line (FEOL) process on a silicon substrate and may be stacked vertically through a back end of line (BEOL) process.

The memory cell may be stacked in an order in which the write transistor is disposed on the ferroelectric read transistor.

Indium-tin-zinc oxide (ITZO) to which a BEOL process is applicable may be applied to the write transistor as a channel layer, and hafnium-zirconium oxide (HZO) and ITZO to which a BEOL process is applicable may be applied to the ferroelectric read transistor as an insulating layer and a channel layer, respectively.

The insulating layer may be formed using ion beam sputtering during the BEOL process forming the ferroelectric read transistor.

A gate structure of the write transistor may have a structure in which a gate electrode serving as a conductive layer, an insulator serving as an insulating layer, and an amorphous oxide semiconductor layer serving as a channel layer are stacked, and a gate structure of the ferroelectric read transistor may have a structure in which a gate electrode serving as a conductive layer, a ferroelectric layer serving as an insulating layer, and an amorphous oxide semiconductor layer serving as a channel layer are stacked.

The ferroelectric layer may be any one selected from the group consisting of HZO, hafnium-lanthanum oxide (HfLaO), hafnium-Si oxide (HfSiO), and hafnium-aluminum oxide (HfAlO), and the amorphous oxide semiconductor layer may be any one selected from the group consisting of ITZO, indium-gallium-zinc oxide (IGZO), indium oxide (InO), and zinc oxide (ZnO).

The ferroelectric read transistor may be a single gate transistor.

The ferroelectric read transistor may be a double gate transistor including a bottom gate and a top gate.

Electrons may be accumulated in a channel by a write voltage applied to the bottom gate of the ferroelectric read transistor, an electric field may be applied to the ferroelectric material to store polarization, and the stored polarization may be maintained by the ferroelectric material and an operating voltage may be changed so that data is stored; and an inversion channel may be formed by an erase voltage applied to the bottom gate and the top gate, and thus an electric field may be applied to the ferroelectric material so that the polarization may be changed and the data erased.

According to another aspect of the present invention, there is provided a method of operating a non-volatile memory device, which includes a memory cell including a write transistor and a ferroelectric read transistor, a write word line connected to a gate terminal of the write transistor, a write bit line connected to a source terminal of the write transistor, a read word line connected to a source terminal of the ferroelectric read transistor, and a read bit line connected to a drain terminal of the ferroelectric read transistor, a drain terminal of the write transistor being connected to a gate terminal of the ferroelectric read transistor, the method including applying a first write control voltage to the write transistor through the write word line and the write bit line, applying a second write control voltage to the ferroelectric read transistor through the read word line and the read bit line, and writing a polarization direction in the ferroelectric material of the ferroelectric read transistor; and applying a first read control voltage to the write transistor through the write word line and the write bit line, applying a second read control voltage to the ferroelectric read transistor through the read word line and the read bit line, and reading data from a drain current of the ferroelectric read transistor varying according to the polarization direction.

BRIEF DESCRIPTION OF THE DRAWINGS

The above and other objects, features and advantages of the present invention will become more apparent to those of ordinary skill in the art by describing exemplary embodiments thereof in detail with reference to the accompanying drawings, in which:

FIG. 7 is a graph showing a comparison result between characteristics of the 2T0C FeDRAM according to one embodiment and the existing DRAM;

Figure 1:
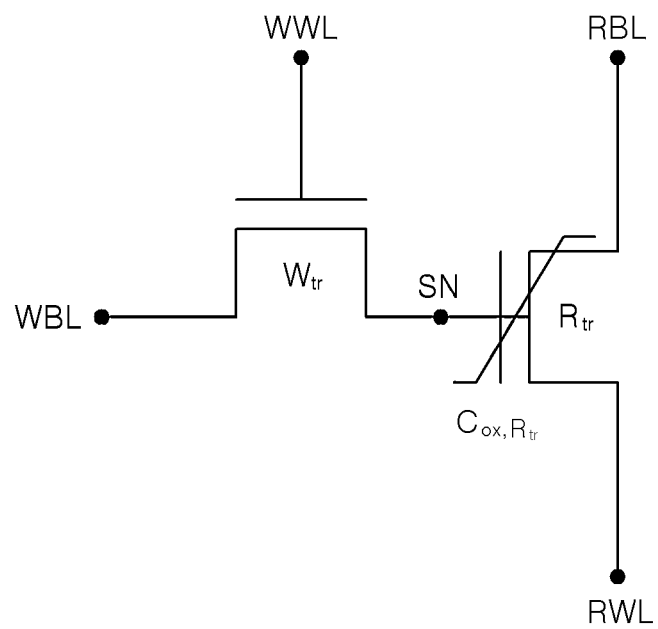
FIG. 1 is a circuit diagram illustrating one memory cell of a non-volatile memory device according to one embodiment.

It is noted that the accompanying drawings are illustrated as references for understanding the technical spirit of the present invention, and thereby the scope of the present invention is not limited thereto.

DETAILED DESCRIPTION OF EXEMPLARY EMBODIMENTS

The above and other objectives, features, and advantages of the present invention will become more apparent from the following description of exemplary embodiments with reference to the accompanying drawings. However, the present invention is not limited to the embodiments disclosed herein and may be implemented in other forms. Rather, the embodiments disclosed herein are provided so that the disclosed content can be more thorough and complete and the spirit of the present invention can be sufficiently conveyed to those skilled in the art, without any intention other than to provide convenience of understanding.

In the present specification, when it is mentioned that certain elements or lines are connected to a target element block, it includes not only a direct connection but also an indirect connection to the target element block through some other elements.

In addition, the same or similar reference numerals presented in each drawing denote the same or similar components whenever possible. In some drawings, connection relationships between elements and lines are only shown for effective description of technical content, and other elements or circuit blocks can be further provided.

Each embodiment described and illustrated herein may also include a complementary embodiment thereof, and it is noted that a general operation of a display device or details of circuits or devices for performing the general operation are not described in detail so as not to obscure the gist of the present invention.

FIG. 1 is a circuit diagram illustrating one memory cell of a non-volatile memory device according to one embodiment. As shown in FIG. 1, a memory cell has a 2T0C structure and includes a write transistor $W_{tr}$ and a ferroelectric read transistor $R_{tr}$. The write transistor $W_{tr}$ may be a metal-oxide semiconductor field-effect transistor (MOSFET). The ferroelectric read transistor $R_{tr}$ may be a ferroelectric field-effect transistor (FeFET). This is a Fe dynamic random access memory (FeDRAM) which uses ferroelectric materials, instead of capacitors used in the existing Si complementary metal-oxide semiconductor (CMOS)-based DRAM.

The shortcomings of the existing DRAM, which inevitably has a low retention time and a destructive operation method, are solved by implementing a non-destructive path, and a ferroelectric material with a theoretically infinite retention time is used.

As shown in the drawing, as metal lines, a write word line WWL, a write bit line WBL, a read word line RWL, and a read bit line RBL are connected to each transistor. Specifically, the write word line WWL is connected to a gate terminal of the write transistor $W_{tr}$, and the write bit line WBL is connected to a source terminal of the write transistor $W_{tr}$. The read word line RWL is connected to a source terminal of the ferroelectric read transistor $R_{tr}$, and the read bit line RBL is connected to a drain terminal of the ferroelectric read transistor $R_{tr}$.

In addition, the two transistors are connected to each other with a storage node SN interposed therebetween. Specifically, a drain terminal of the write transistor $W_{tr}$ is connected to a gate terminal of the ferroelectric read transistor $R_{tr}$ at the storage node SN.

The 2T0C FeDRAM shown in the drawing uses a ferroelectric material, and the ferroelectric material is a material that maintains polarization in a ground state at a Curie temperature or less and is applied as an insulating layer $C_{ox}$, $R_{tr}$ of the read transistor of the FeDRAM. Due to the ferroelectric material applied as the insulating layer, information of the 2T0C FeDRAM is stored in the read transistor, and once stored information has an expected retention value of about 10 years due to characteristics of the ferroelectric material.

A Hf-based ferroelectric material may be applied as the ferroelectric material. As an example, any one selected from the group consisting of hafnium-zirconium oxide (HZO), hafnium-lanthanum oxide (HfLaO), hafnium-Si oxide (HfSiO), and hafnium-aluminum oxide (HfAlO) may be applied as the Hf-based ferroelectric material.

Indium-tin-zinc oxide (ITZO), which is a type of oxide semiconductor, may be applied as a channel layer of each transistor. ITZO is a material which has a low leakage current and high mobility and which is advantageous for a low-power operation. Meanwhile, ITZO is an example, and various amorphous oxide semiconductors such as indium-gallium-zinc oxide (IGZO), indium oxide (InO), and zinc oxide (ZnO) may be applied.

In addition, various conductive materials may be applied to the metal materials used in the write word line WWL, the write bit line WBL, the read bit line RBL, and the read word line RWL of the 2T0C FeDRAM, as necessary.

Figure 2:
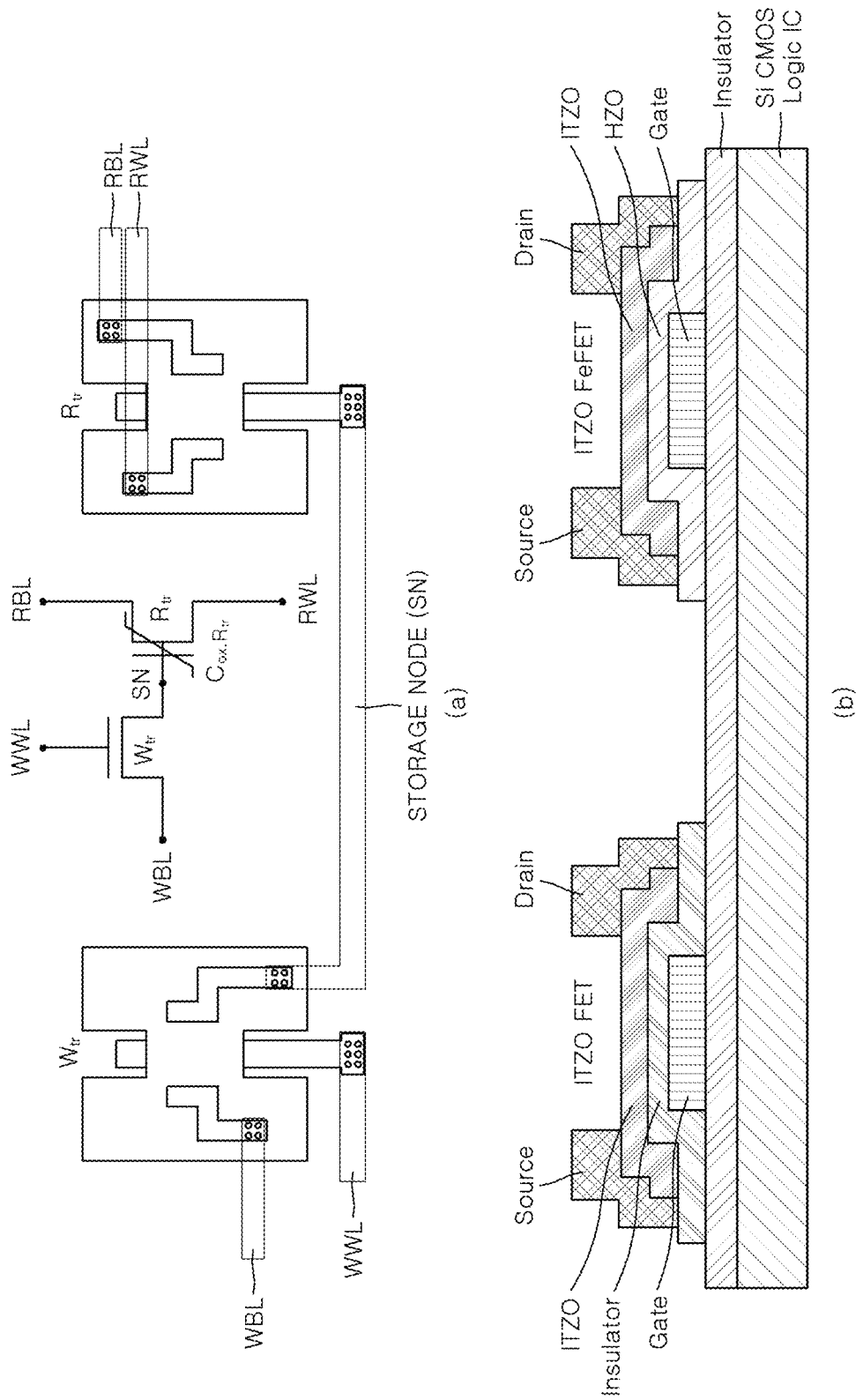
FIG. 2 shows a plan view and a cross-sectional view of one memory cell of the non-volatile memory device according to one embodiment.

FIG. 2 shows a plan view and a cross-sectional view of one memory cell of the non-volatile memory device according to one embodiment. Referring to FIG. 2A first, a source of the write transistor $W_{tr}$ corresponds to the write bit line WBL, and a gate of the write transistor $W_{tr}$ corresponds to the write word line WWL. A source of the read transistor $R_{tr}$ corresponds to the read word line RWL, and a drain of the read transistor $R_{tr}$ corresponds to the read bit line RBL. The drain of the write transistor $W_{tr}$ and the gate of the read transistor $R_{tr}$ are connected to each other through a storage node SN, and a device structure capable of minimizing resistance of the storage node SN is proposed.

Referring to FIG. 2B, a gate structure included in the write transistor $W_{tr}$ has a stacked shape of a gate electrode Gate serving as a conductive layer, an insulator serving as an insulating layer, and ITZO serving as a channel layer. A gate structure included in the ferroelectric read transistor $R_{tr}$ has a stacked shape of a gate electrode Gate serving as a conductive layer, a ferroelectric layer (HZO) serving as an insulating layer, and an oxide semiconductor layer (ITZO) serving as a channel layer. The reference symbol HZO is only used to emphasize hafnium-zirconium oxide, which is a ferroelectric material, as the insulating layer, and the reference symbol ITZO is only used to emphasize indium-tin-zinc oxide, which is an amorphous oxide semiconductor, as the channel layer, and these are not necessarily used to limit the presented materials. For example, when HfLaO, HfSiO, or HfAlO is used instead of HZO, HLO, HSO, or HAO may be used as the reference symbol, and when IGZO, InO, or ZnO is used instead of ITZO, IGZO, InO, or ZnO may be used as the reference symbol.

According to one embodiment, the two transistors $W_{tr}$ and $R_{tr}$ may be deposited through the same process. Both the write transistor $W_{tr}$ and the ferroelectric read transistor $R_{tr}$ may be disposed on an insulating layer pattern Insulator of a Si CMOS logic IC. That is, the 2T0C FeDRAM is a device suitable for a silicon CMOS process and may be deposited through a process using a Si CMOS logic IC.

Figure 3:
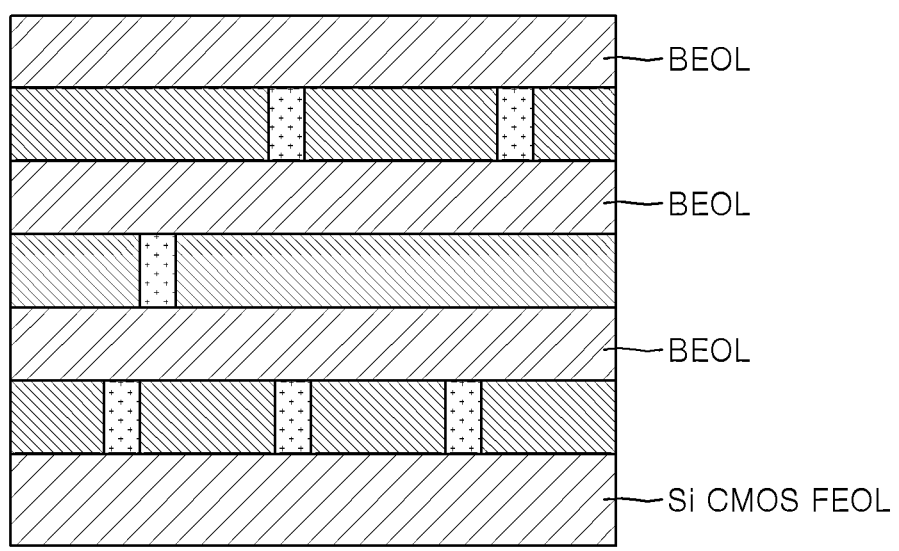
FIG. 3 is a cross-sectional view illustrating a monolithic three-dimensional (3D) integrated structure of a 2T0C Fe dynamic random access memory (FeDRAM) according to one embodiment.

FIG. 3 is a cross-sectional view illustrating a monolithic three-dimensional (3D) integrated structure of a 2T0C Fe FeDRAM according to one embodiment. As shown in the drawing, the Si CMOS logic IC may be integrated on a silicon substrate through a front end of line (FEOL) process, and a bit cell may be stacked on the Si CMOS logic IC through a back end of line (BEOL) process. To this end, ITZO and HZO, to which the BEOL process is applicable, may be applied to each transistor.

Figure 4:
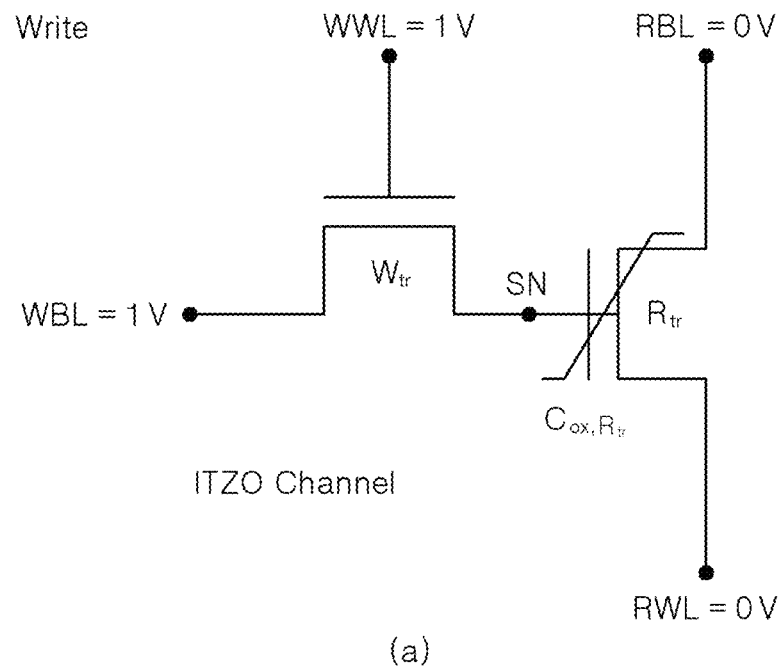
FIG. 4 is a diagram illustrating write and read operations of the 2T0C FeDRAM cell according to one embodiment.
Figure 4:
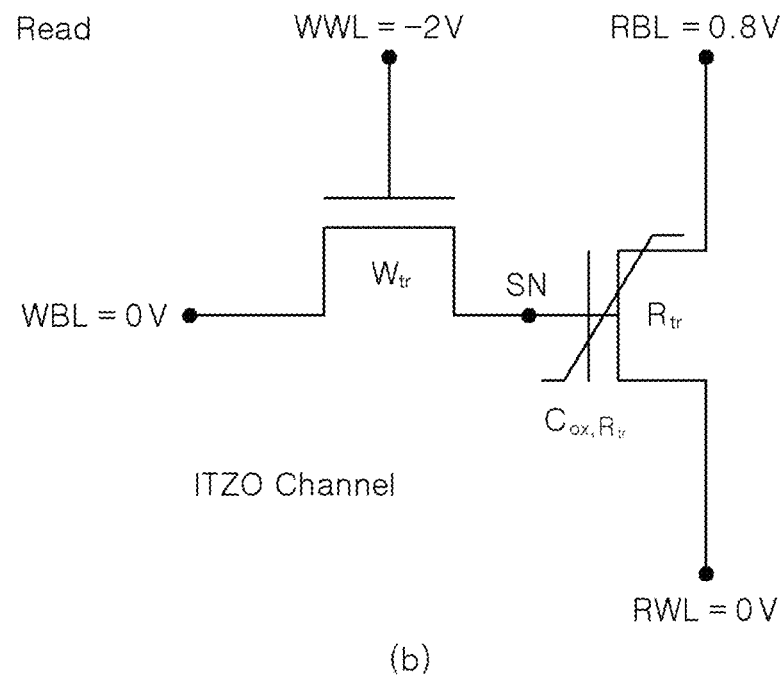

FIG. 4 is a diagram illustrating write and read operations of the 2T0C FeDRAM cell according to one embodiment. FIG. 4A shows the write operation, and FIG. 4B shows the read operation.

Referring to FIG. 4A first, in the write operation, a first write control voltage is applied to the write transistor $W_{tr}$ through the write word line WWL and the write bit line WBL, and a second write control voltage is applied to the ferroelectric read transistor $R_{tr}$ through the read word line RWL and the read bit line RBL so that a polarization direction is written in a ferroelectric material $C_{ox}$, $R_{tr}$ of the ferroelectric read transistor $R_{tr}$. As an example, 1 V may be applied to the write word line WWL, 1 V may be applied to the write bit line WBL, 0 V may be applied to the read bit line RBL, and 0 V may be applied to the read word line RWL. In this case, a channel layer may be formed in the write transistor $W_{tr}$ due to the write word line WWL, and information may be stored in a polarized form in the ferroelectric material $C_{ox}$, $R_{tr}$ of the ferroelectric read transistor $R_{tr}$ through the channel layer of the write transistor $W_{tr}$ due to the write bit line WBL. Thereafter, even when no voltage is applied, the information stored in the polarized form may be maintained.

Referring to FIG. 4B, in the read operation, a first read control voltage is applied to the write transistor $W_{tr}$ through the write word line WWL and the write bit line WBL, a second read control voltage is applied to the ferroelectric read transistor $R_{tr}$ through the read word line RWL and read bit line RBL so that data is read from a drain current of the ferroelectric read transistor $R_{tr}$, which varies according to the polarization direction of the ferroelectric material $C_{ox}$, $R_{tr}$ of the ferroelectric read transistor $R_{tr}$. As an example, −2 V may be applied to the write word line WWL, 0 V may be applied to the write bit line WBL, 0.8 V may be applied to the read bit line RBL, and 0 V may be applied to the read word line RWL. In this case, a voltage potential barrier may be generated between the write transistor $W_{tr}$ and the ferroelectric read transistor $R_{tr}$ due to the voltage applied to the write word line WWL to prevent any unexpected reverse operation. In this state, carriers move from the read bit line RBL through the channel layer induced by the polarization generated by the writing process, and thus a current is read. In this case, the read current varies according to whether the polarization is present. In this way, it is possible to determine whether writing is performed on the device.

It is noted that, during the above-described write and read processes, a portion where the voltage is applied and a portion where the current flows do not overlap absolutely. The structural characteristics of the 2T0C FeDRAM according to the embodiment enable a non-destructive read method to be implemented.

Figure 5:
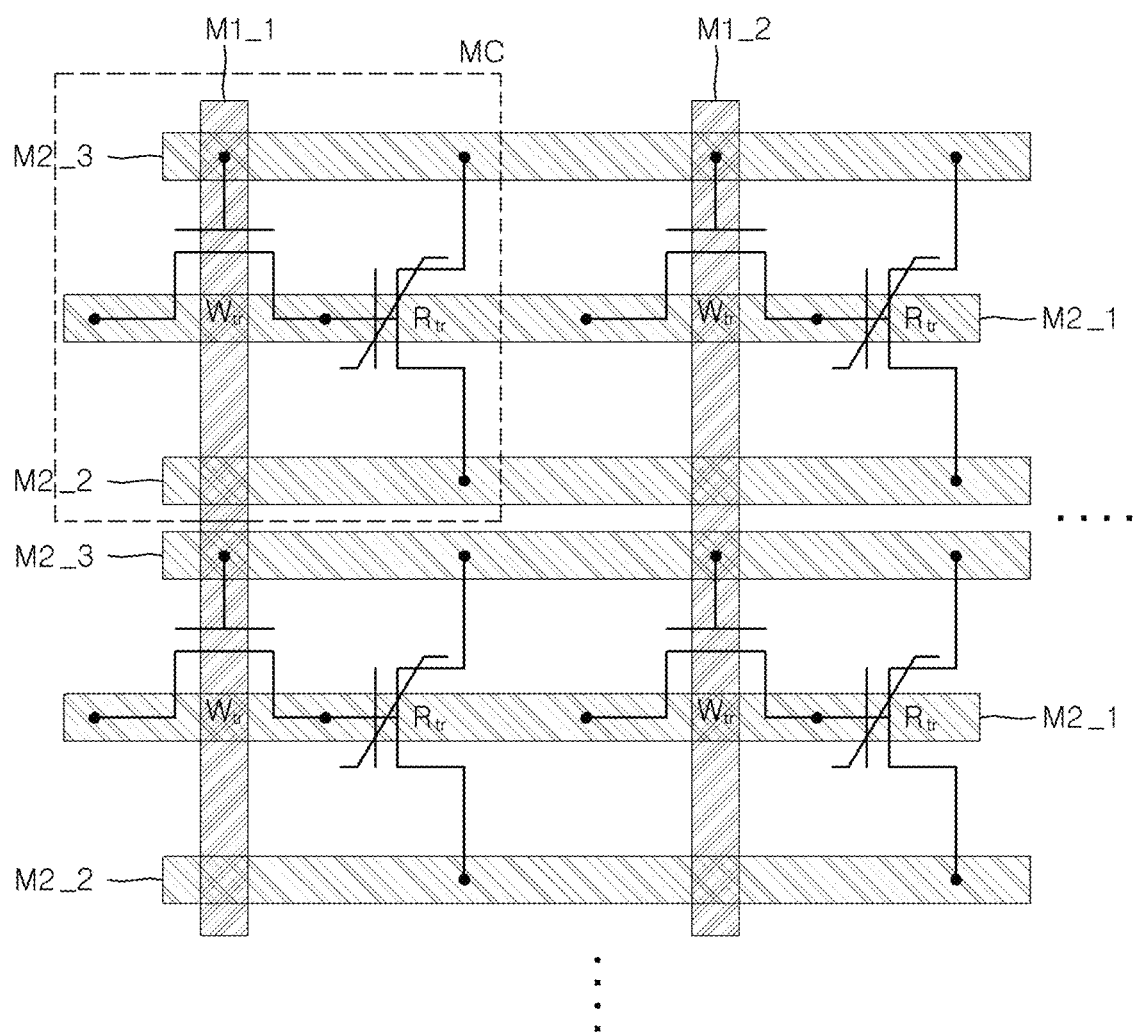
FIG. 5 is a diagram illustrating an implementation example of a cell array of the 2T0C FeDRAM according to one embodiment.

FIG. 5 is a diagram illustrating an implementation example of a cell array of the 2T0C FeDRAM according to one embodiment. The 2T0C FeDRAM formed of the write transistor $W_{tr}$ and the ferroelectric read transistor $R_{tr}$ may be externally driven generally in an active matrix manner through two metal lines M1 and M2. Reference symbols M1_1 and M1_2 are referred to as M1. Reference symbols M2_1, M2_2, and M2_3 are referred to as M2. A description will be made based on one cell MC indicated by a dotted line in the following drawing.

A first metal line M1_1 is electrically connected to gates of write transistors $W_{tr}$. By applying a voltage that is greater than or equal to a threshold voltage to the first metal line M1_1, channel layers of the write transistors $W_{tr}$ may be formed. The first metal line M1_1 may correspond to the write word line WWL.

The above description is based on the first metal line M1_1 on the left side of the drawing, but the same description can be applied to a first metal line M1_2 on the right side of the drawing.

Second metal lines M2_1, M2_2, and M2_3 are electrically connected to sources of the write transistors $W_{tr}$, sources of the read transistors $R_{tr}$, and drains of the read transistors $R_{tr}$. The second metal line M2_1 at an intermediate stage in the drawing is connected to the sources of the write transistors $W_{tr}$, the second metal line M2_2 at a lower stage in the drawing is connected to the sources of the read transistors $R_{tr}$, and the second metal line M2_3 at an upper end in the drawing is connected to the drains of the read transistors $R_{tr}$. The second metal lines M2_1, M2_2, and M2_3 may serve to store information in the read transistor $R_{tr}$ during the write process and to read the stored information during the read process. The second metal line M2_1 at the intermediate end of the drawing may be connected to the write bit line WBL, the second metal line M2_2 at the lower end of the drawing may be connected to the read word line RWL, and the second metal line M2_3 at the upper end of the drawing may be connected to the read bit line RBL.

A gap between the first metal line M1 and the second metal line M2 is filled with a passivation material, and various conductive materials may be applied as metal materials constituting the first metal line M1 and the second metal line M2, as necessary.

Figure 6:
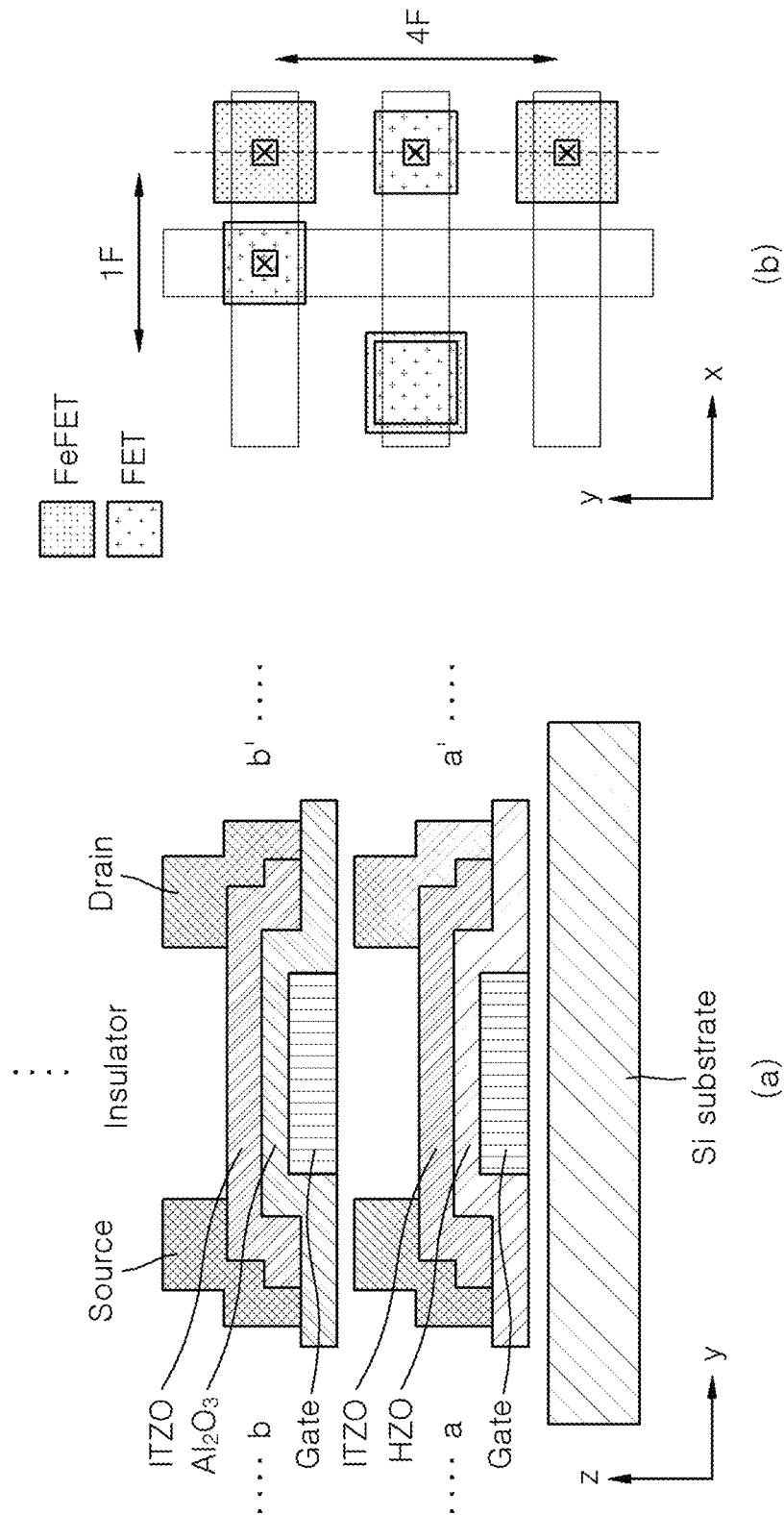
FIG. 6 shows a cross-sectional view and a plan view of a 3D integrated 2T0C FeDRAM cell according to one embodiment.

FIG. 6 shows a cross-sectional view and a plan view of a 3D integrated 2T0C FeDRAM cell according to one embodiment. FIG. 6A shows the cross-sectional view, and FIG. 6B shows the plan view.

First, as shown in FIG. 6A, in the 2T0C FeDRAM cell, the ferroelectric read transistor of the FeFET and the write transistor of the FET may be vertically integrated. In this case, it is noted that a high-density general-purpose memory device may be achieved by performing 3D integration by applying ITZO and HZO to which a BEOL process is applicable. That is, HZO may be applied as a ferroelectric material and ITZO may be applied as an oxide semiconductor material in the FeFET, and ITZO may be applied as an oxide semiconductor material in the FET. Meanwhile, for example, an $Al_2O_3$ thin film with a thickness of 10 nm may be used as an insulating material in the FET.

When the 3D integration is performed according to one embodiment, HZO may be formed using ion beam sputtering, which allows an additional annealing process at a relatively low temperature, rather than forming HZO using atomic layer deposition (ALD). This is advantageous for a 3D process of ITZO, which requires a low-temperature process.

As shown in FIG. 6B, in the 2T0C FeDRAM cell, the write transistor of FET may be disposed on the ferroelectric read transistor of the FeFET. The first metal line connected to the gate of the FET extends in a y direction in the drawing. The second metal line connected to the drain of the FeFET and positioned at the upper end of the drawing extends in an x-direction in the drawing. The second metal line connected to the source of the FET and positioned at the intermediate end of the drawing extends in the x-direction in the drawing. In addition, the second metal line connected to the source of the FeFET and positioned at the lower end of the drawing extends in the x-direction in the drawing. Meanwhile, a connection portion between each transistor and the metal line is marked with an x, and since the drain of the FET and the gate of the FeFET may be connected at the storage node, a separate mark is not indicated.

FIG. 7 is a graph showing a comparison result between characteristics of the 2T0C FeDRAM according to one embodiment and the existing DRAM.

Referring to FIG. 7, a 1T-1C DRAM has a low retention time and a destructive read method and also has low integration. A 2T DRAM has a lower retention time and lower integration than the 1T-1C DRAM, but since the 2T DRAM uses a gain of the transistor, physical paths for reading and writing are separated, and thus a non-destructive method is implemented. Compared to the 1T-1C DRAM and the 2T type DRAM, an AOS 2T DRAM achieves the highest retention time using an amorphous oxide semiconductor and has non-destructive data using the gain of the transistor. In addition, 3D integration of bit cells may be possible using the BEOL process to increase integration. It can be confirmed that a 2T-0C FeDRAM according to one embodiment is non-destructive and has a retention time of a unit that is incomparable to the above three structures. In addition, the integration is very high.

Figure 8A:
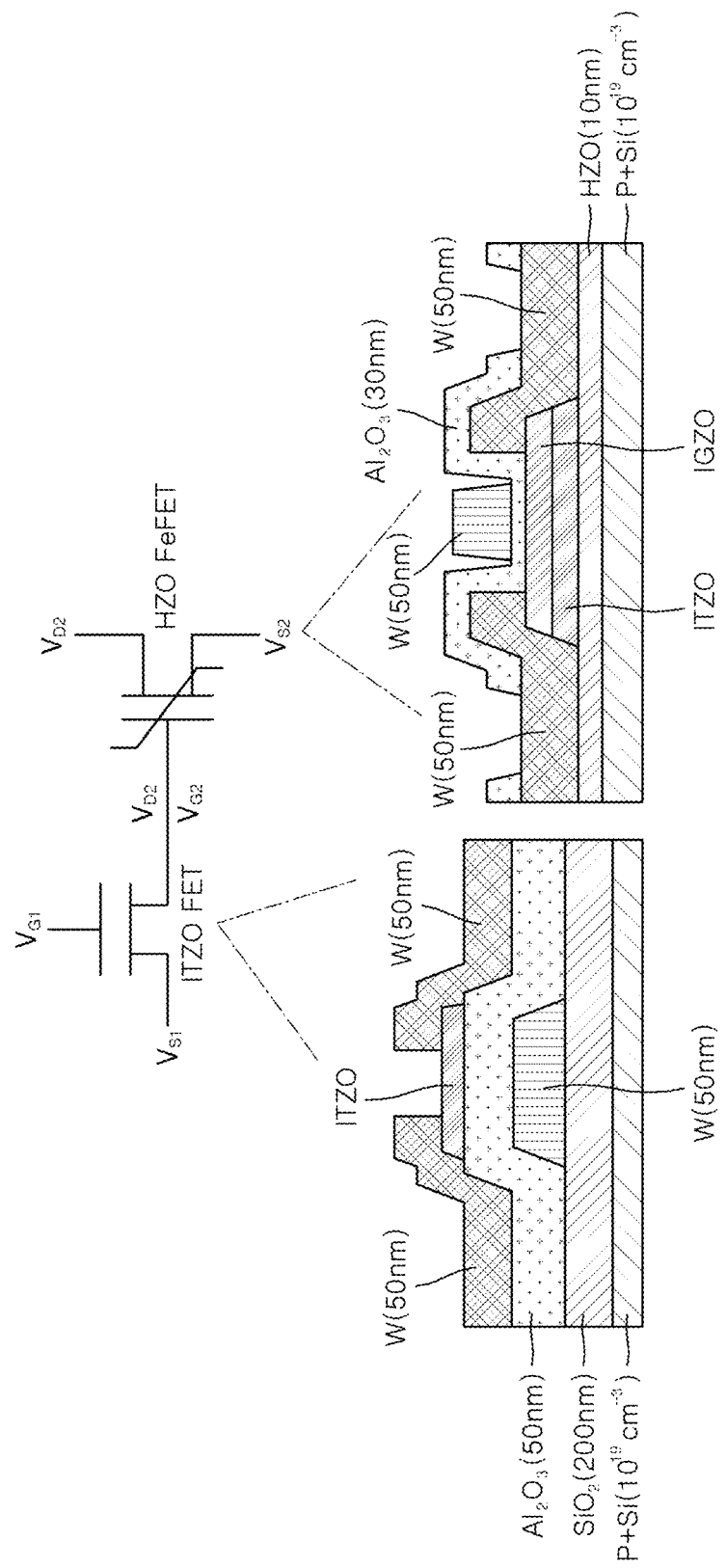
FIG. 8A is a diagram illustrating a structure of the 2T0C FeDRAM cell to which a double gate is applied according to one embodiment.
Figure 8B:
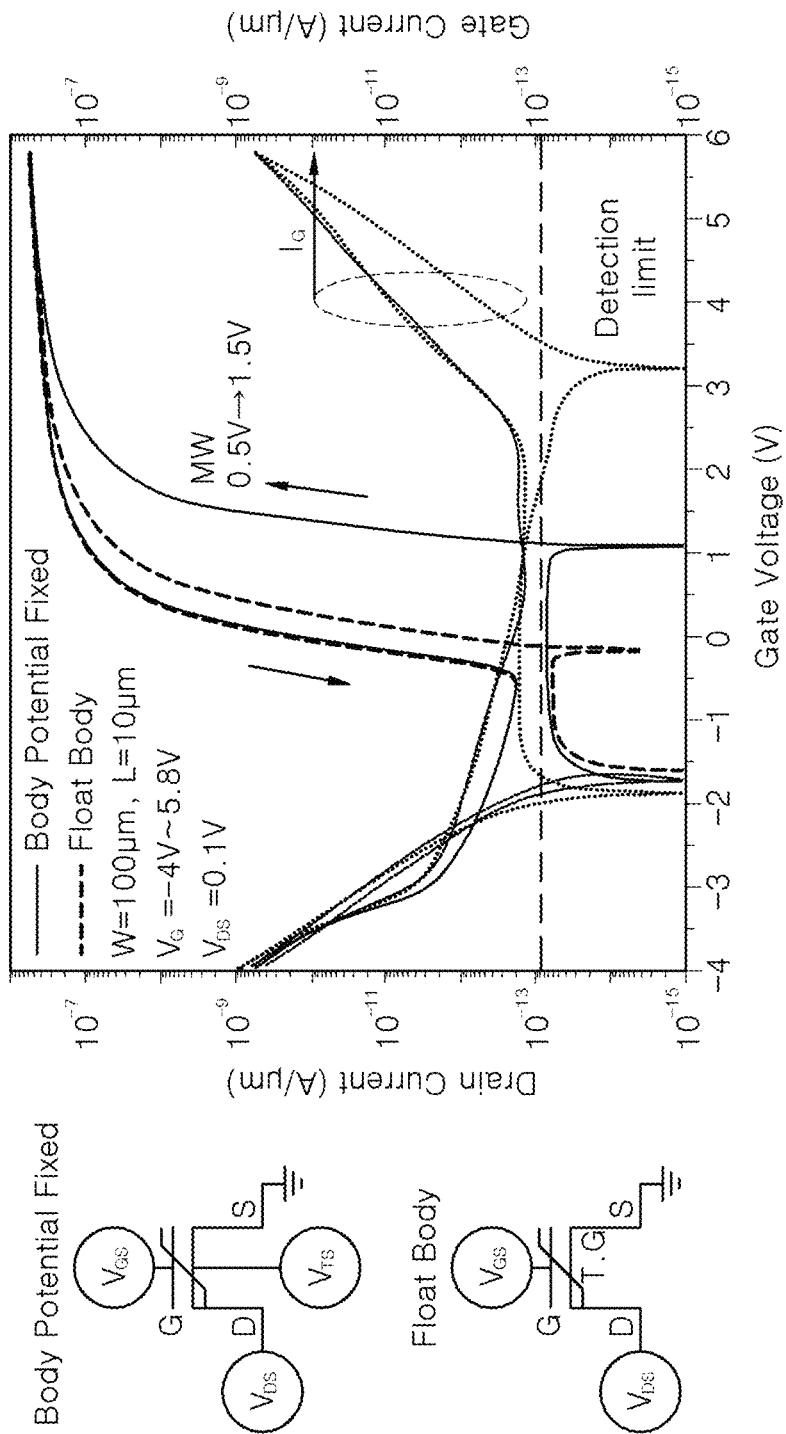
FIG. 8B is a diagram illustrating a transfer curve of a Fe field effect transistor (FeFET) used in a read transistor of the 2T0C FeDRAM of FIG. 8A for each case according to a body potential.

FIG. 8A is a diagram illustrating a structure of the 2T0C FeDRAM cell to which a double gate is applied according to one embodiment. FIG. 8B shows a transfer curve of FeFET used in the read transistor of the 2T0C FeDRAM of FIG. 8A for each case (body potential fixed and float body) according to a body potential. The body potential fixed corresponds to an example in which a double gate is applied, and the floating body corresponds to an example in which a single gate is applied. In addition, FIG. 8C is a schematic diagram illustrating an operating principle of an amorphous oxide semiconductor film-based FeFET according to one embodiment, and FIG. 8D is a schematic diagram illustrating a write state and an erase state of the amorphous oxide semiconductor film-based FeFET according to one embodiment.

As shown in FIG. 8A, the read transistor of the 2T0C FeDRAM is a double gate so that an electric field can be applied more efficiently to HZO.

Figure 8C:
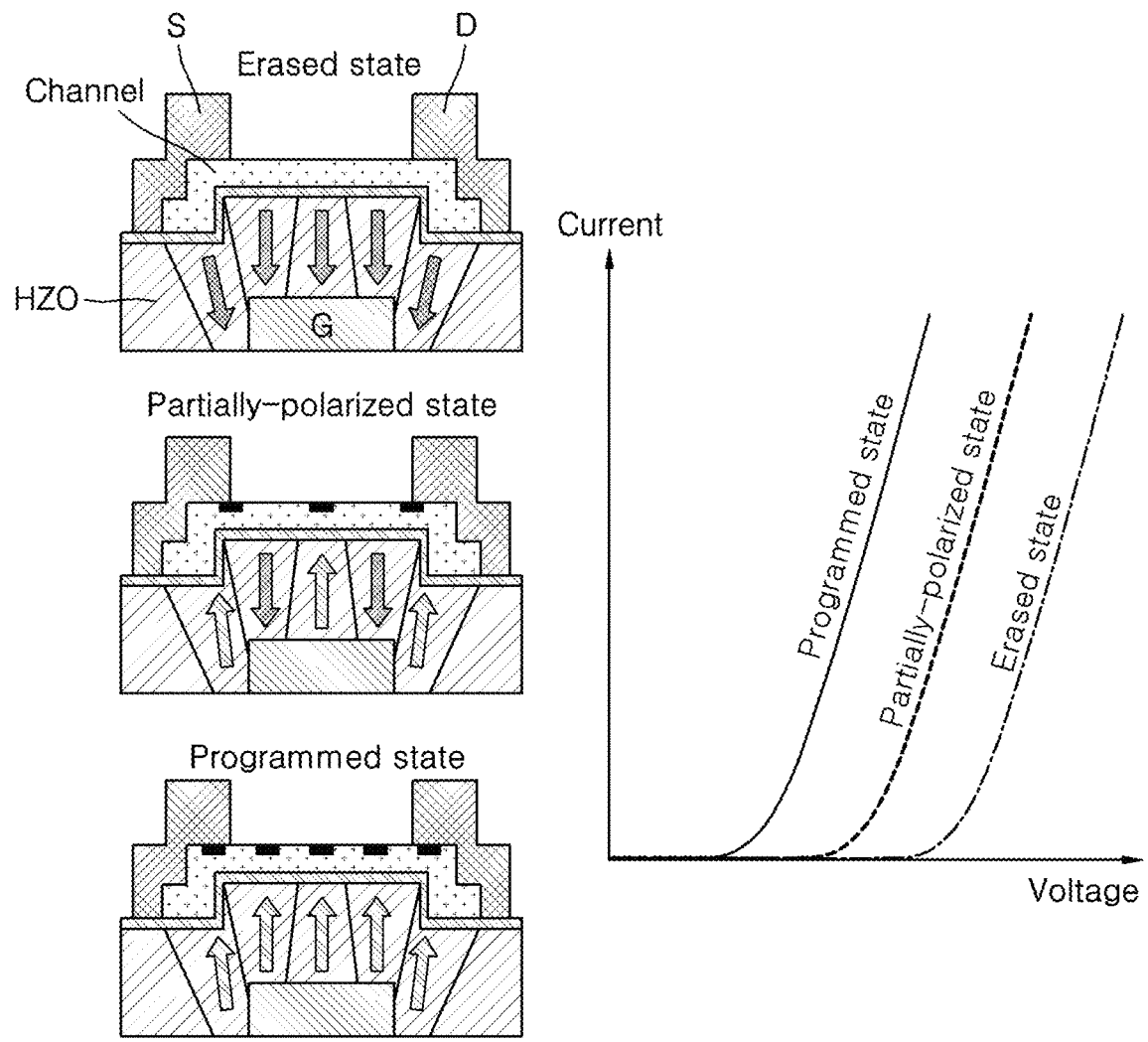
FIG. 8C is a schematic diagram illustrating an operating principle of an amorphous oxide semiconductor film-based FeFET according to one embodiment.
Figure 8D:
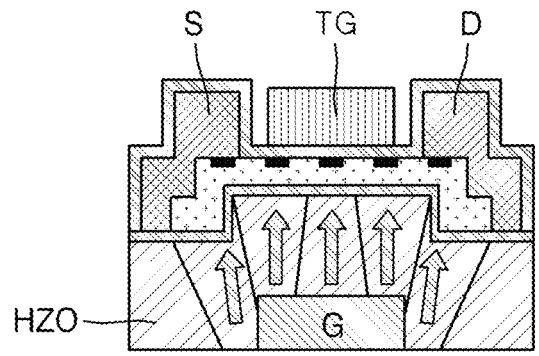
FIG. 8D is a schematic diagram illustrating a write state and an erase state of the amorphous oxide semiconductor film-based FeFET according to one embodiment.
Figure 8D:
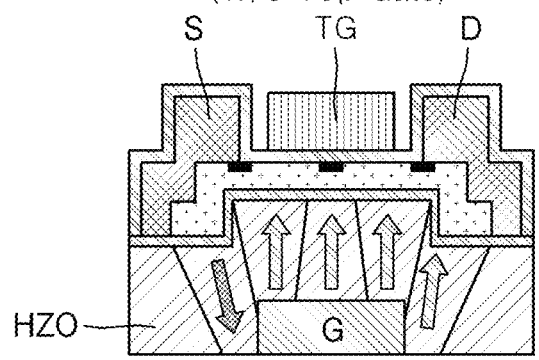
Figure 8D:
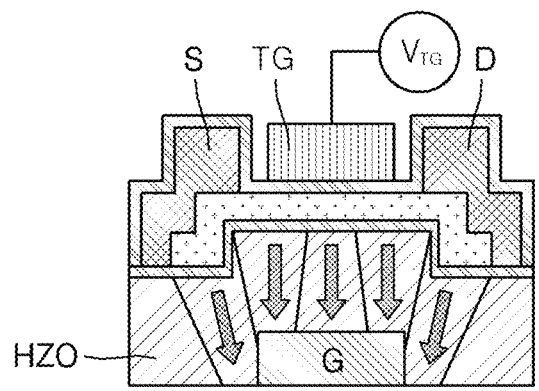

Specifically, to describe the principle with reference to FIGS. 8C and 8D, when a (+) voltage is applied to the gate, electrons in the channel accumulate, and thus an electric field is efficiently applied to HZO and polarization is stored. The polarization of HZO is maintained by ferroelectricity, and thus an operating voltage Vth is changed and data is stored. However, since the amorphous oxide semiconductor used as the channel layer is an n-type semiconductor with many electrons and few holes, the amorphous oxide semiconductor has a characteristic of a large band gap, and a problem in which, even when a (−) voltage is applied to the gate, an inversion channel is not formed and the voltage is not efficiently applied to HZO may occur. That is, a problem with poor erase may occur. To solve the above problem, a top gate is positioned on the channel, and a voltage is applied to the top gate so that an electric field effectively acts on HZO, the polarization of HZO is changed, and thus erasing is possible. That is, in the case of a single gate, an inversion channel is not properly formed and thus a voltage cannot be efficiently applied to HZO, but in the case of a double gate, the voltage may be efficiently applied to HZO through the voltage applied to the top gate. When a transistor of a cross section shown on the left side of FIG. 8A is a single gate, like a transistor of a cross section shown on the right side, a double gate may be implemented by forming a passivation layer $Al_2O_3$ above a source and a drain and placing a top gate on the passivation layer $Al_2O_3$. The source and the drain below the passivation layer may be connected to an external terminal through a via hole. Meanwhile, in the cross section shown on the right side, a lower gate is not shown for convenience of description, but the same gate as in the cross section shown on the left side may be disposed between HZO and $P^+$ Si to serve as a lower gate.

As shown in FIG. 8B, it can be seen that the read transistor of the 2T0C FeDRAM is formed as a double gate so that erasing can be easily performed and a memory window can be expanded by effectively applying a voltage to a ferroelectric material. In the drawing, an example in which a memory window MW is expanded from 0.5 V to 1.5 V is shown. The number of data states capable of being written and read may increase through the expansion of the memory window. That is, it is possible to secure a large memory window due to the double gate.

Figure 9:
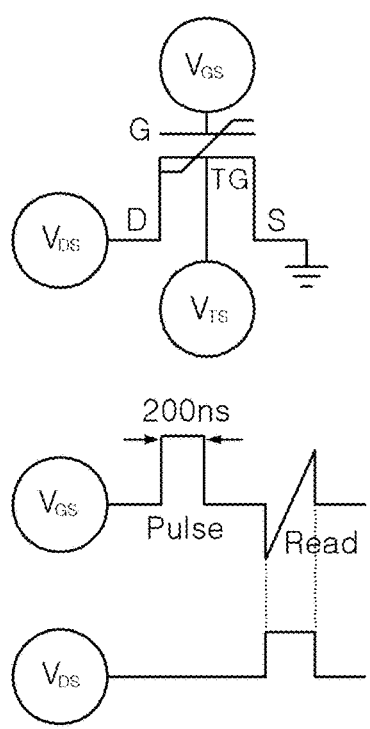
FIG. 9 is a diagram showing results of non-volatile characteristics and durability characteristics of a FeFET used in the read transistor of the 2T0C FeDRAM according to one embodiment.
Figure 9:
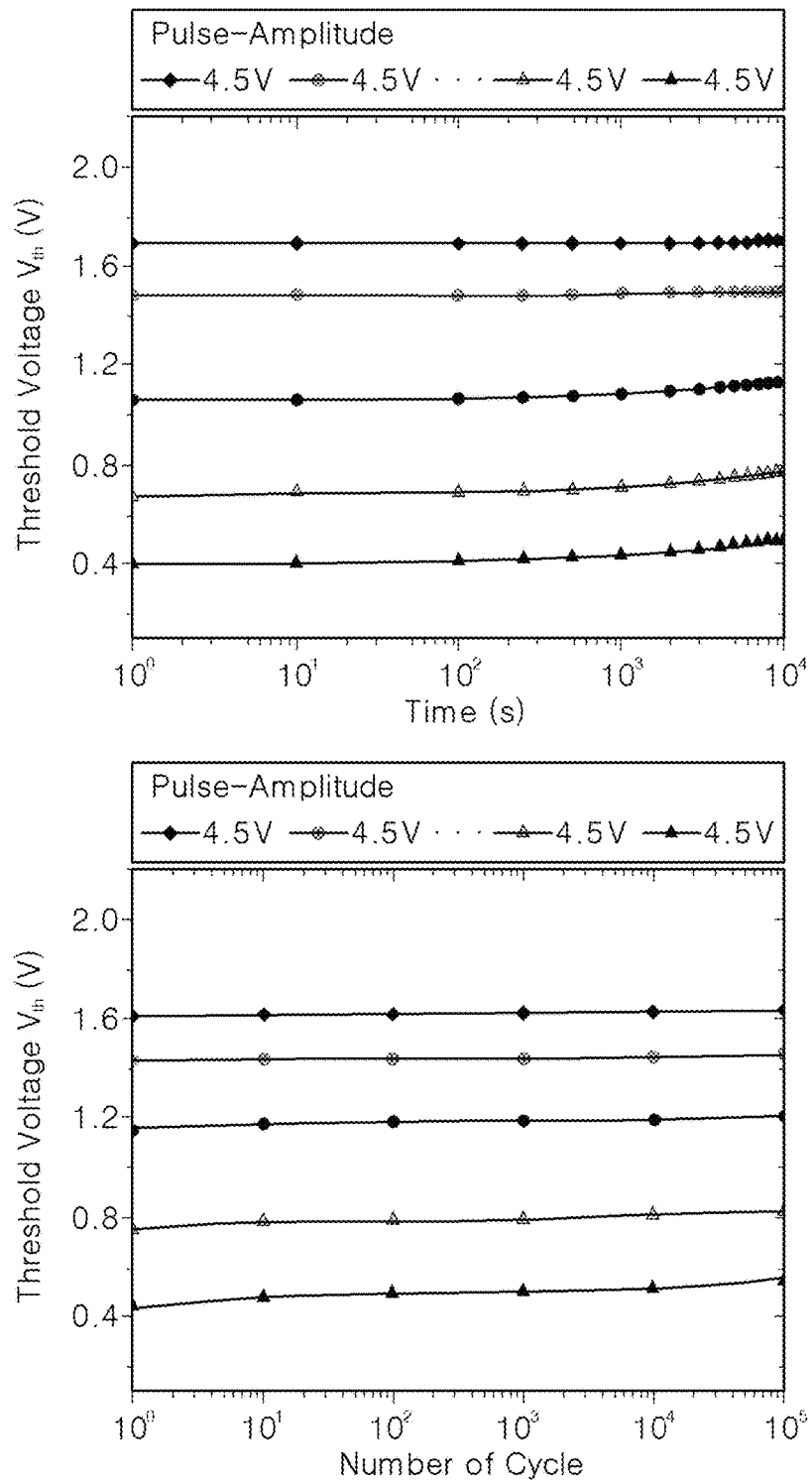

FIG. 9 is a diagram showing results of non-volatile characteristics and durability characteristics of a FeFET used in the read transistor of the 2T0C FeDRAM according to one embodiment. A situation in which the voltage is applied to the FeFET is also shown on the left side of the drawing. In this way, unlike the existing DRAM, the 2T0C FeDRAM is expected to use less power due to having a longer data retention time. Therefore, it can be seen that low-power driving of the 2T0C FeDRAM is possible and the 2T0C FeDRAM has non-volatile characteristics. Consequently, the 2T0C FeDRAM may have durability that does not change device characteristics despite repeated operations. That is, even in the FeFET formed of the double gate, non-volatile characteristics and durability due to an increased data retention time can be confirmed.

Figure 10:
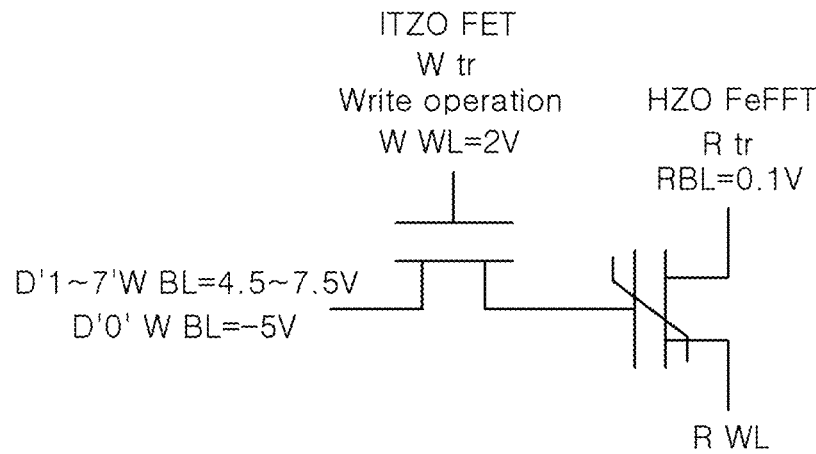
FIG. 10 is a diagram showing non-volatile results of a multi-level state 2T0C Fe ferroelectric RAM (FeFRAM) according to one embodiment.
Figure 10:
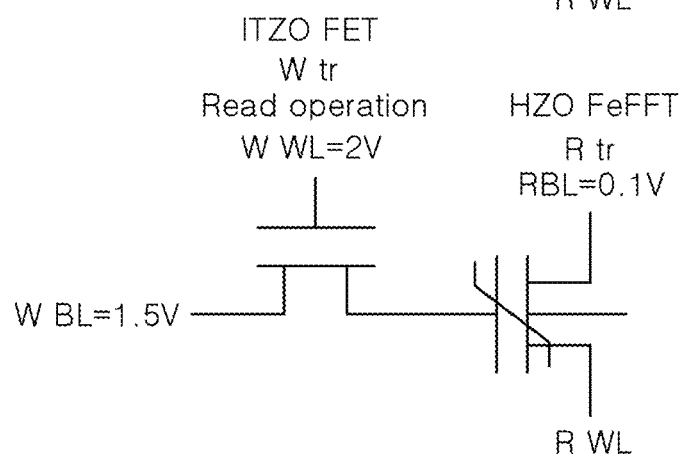
Figure 10:
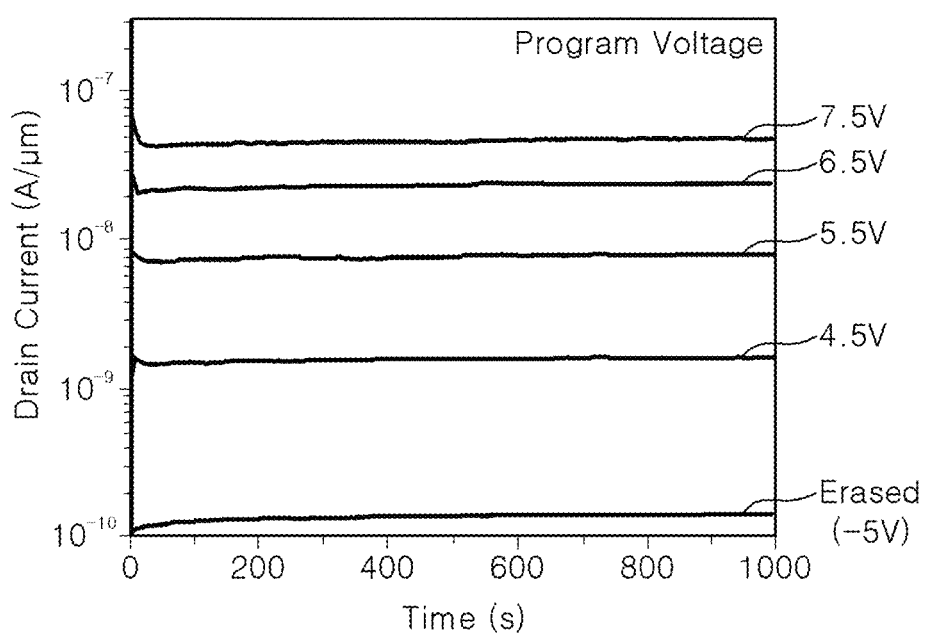

FIG. 10 is a diagram showing non-volatile results of a multi-level state 2T0C FeFRAM according to one embodiment. As shown in the drawing, due to the characteristics of FeFET, a drain current of the read transistor may be maintained for almost 1000 seconds or more during a read operation in the 2T0C FeDRAM. The operating voltage of the 2T0C FeDRAM may be adjusted to various states. Thus, the 2T0C FeDRAM may be used as a multi-level state storage device capable of storing multiple states instead of two states of 1 and 0 in the existing DRAM so that high efficiency relative to an area can be achieved. The 2T0C FeDRAM also has a probability of being used as a neuromorphic device such as a synapse that mimics the human brain.

According to the above-described embodiment, a new material and a structure of a DRAM can be provided. Unlike the existing DRAM, since the 2T0C FeDRAM according to one embodiment has a high retention time, the 2T0C FeDRAM has lower power usage so that a low-power and high-efficiency operation is possible unlike the existing DRAM. In the structure proposed for the 2T0C FeDRAM according to one embodiment, physical voltage application directions for reading and writing do not overlap, and thus information is not lost so that non-destructive driving is possible unlike the existing DRAM. In addition, the FeDRAM using amorphous oxide semiconductors and a ferroelectric material can be highly integrated in 3D.

According to the technology, a problem in which information is lost due to an overlap of read and write paths in a memory device is solved so that implementation of a non-destructive path can be achieved.

In addition, according to the technology, a problem of additional power consumed by a refresh operation due to a short retention time of the existing DRAM can be solved.

In this case, according to the technology, an integration problem is also solved.

In addition, according to the technology, a memory window can be expanded by effectively applying a voltage to a ferroelectric material.

In addition, unlike the existing DRAM, according to the technology, a data retention time is long and non-volatile characteristics are provided so that a low-power and high-efficiency operation with lower power consumption is possible.

In addition, according to the technology, an operating voltage can be adjusted to various states, and thus it is possible to use the device as a storage device of multi-level cells, which can store multiple states instead of two states of 1 and 0 in the existing DRAM so that high integration can be achieved.

While the present invention has been described with reference to specific items such as particular components, exemplary embodiments, and the accompanying drawings, these are merely provided to aid in understanding the present invention, and the present invention is not limited to these embodiments, and those skilled in the art to which the present invention pertains can perform various alterations and modifications from the description of the present invention. Therefore, the spirit of the present invention should not be limited to the above-described embodiments, and it should be construed that the appended claims as well as all equivalents or equivalent modifications of the appended claims will fall within the scope of the present invention.

What is claimed is:

1. A non-volatile memory device comprising:
   a memory cell including a write transistor and a ferroelectric read transistor;
   a write word line connected to a gate terminal of the write transistor;
   a write bit line connected to a source terminal of the write transistor;
   a read word line connected to a source terminal of the ferroelectric read transistor; and
   a read bit line connected to a drain terminal of the ferroelectric read transistor,
   wherein a drain terminal of the write transistor is connected to a gate terminal of the ferroelectric read transistor.

2. The non-volatile memory device of claim 1, wherein the drain terminal of the write transistor is connected to the gate terminal of the ferroelectric read transistor through a storage node and induces a polarization direction in a ferroelectric material of the ferroelectric read transistor while the write transistor is turned on.

3. The non-volatile memory device of claim 2, wherein the ferroelectric material includes hafnium-zirconium oxide.

4. The non-volatile memory device of claim 2, wherein the memory cell is formed on a silicon complementary metal-oxide semiconductor (CMOS) logic integrated circuit through a front end of line (FEOL) process on a silicon substrate and is stacked vertically through a back end of line (BEOL) process.

5. The non-volatile memory device of claim 4, wherein the memory cell is stacked in an order in which the write transistor is disposed on the ferroelectric read transistor.

6. The non-volatile memory device of claim 5, wherein indium-tin-zinc oxide (ITZO) to which a BEOL process is applicable is applied to the write transistor as a channel layer, and hafnium-zirconium oxide (HZO) and ITZO to which a BEOL process is applicable are applied to the ferroelectric read transistor as an insulating layer and a channel layer, respectively.

7. The non-volatile memory device of claim 6, wherein the insulating layer is formed using ion beam sputtering during the BEOL process forming the ferroelectric read transistor.

8. The non-volatile memory device of claim 2, wherein the ferroelectric read transistor is a single gate transistor.

9. The non-volatile memory device of claim 2, wherein the ferroelectric read transistor is a double gate transistor including a bottom gate and a top gate.

10. The non-volatile memory device of claim 9, wherein:
electrons are accumulated in a channel by a write voltage applied to the bottom gate of the ferroelectric read transistor, an electric field is applied to the ferroelectric material to store polarization, and the stored polarization is maintained by the ferroelectric material and an operating voltage is changed so that data is stored; and
an inversion channel is formed by an erase voltage applied to the bottom gate and the top gate, and thus an electric field is applied to the ferroelectric material so that the polarization is changed and the data erased.

11. The non-volatile memory device of claim 1, wherein:
a gate structure of the write transistor has a structure in which a gate electrode serving as a conductive layer, an insulator serving as an insulating layer, and an amorphous oxide semiconductor layer serving as a channel layer are stacked; and
a gate structure of the ferroelectric read transistor has a structure in which a gate electrode serving as a conductive layer, a ferroelectric layer serving as an insulating layer, and an amorphous oxide semiconductor layer serving as a channel layer are stacked.

12. The non-volatile memory device of claim 11, wherein:
the ferroelectric layer includes any one selected from the group consisting of hafnium-zirconium oxide (HZO), hafnium-lanthanum oxide (HfLaO), hafnium-Si oxide (HfSiO), and hafnium-aluminum oxide (HfAlO); and
the amorphous oxide semiconductor layer includes any one selected from the group consisting of indium-tin-zinc oxide (ITZO), indium-gallium-zinc oxide (IGZO), indium oxide (InO), and zinc oxide (ZnO).

13. A method of operating a non-volatile memory device, which includes a memory cell including a write transistor and a ferroelectric read transistor, a write word line connected to a gate terminal of the write transistor, a write bit line connected to a source terminal of the write transistor, a read word line connected to a source terminal of the ferroelectric read transistor, and a read bit line connected to a drain terminal of the ferroelectric read transistor, a drain terminal of the write transistor being connected to a gate terminal of the ferroelectric read transistor, the method comprising:
applying a first write control voltage to the write transistor through the write word line and the write bit line, applying a second write control voltage to the ferroelectric read transistor through the read word line and the read bit line, and writing a polarization direction in the ferroelectric material of the ferroelectric read transistor; and
applying a first read control voltage to the write transistor through the write word line and the write bit line, applying a second read control voltage to the ferroelectric read transistor through the read word line and the read bit line, and reading data from a drain current of the ferroelectric read transistor varying according to the polarization direction.

14. The method of claim 13, wherein the ferroelectric read transistor is a single gate transistor.

15. The method of claim 13, wherein the ferroelectric read transistor is a double gate transistor including a bottom gate and a top gate.

16. The method of claim 13, wherein:
electrons are accumulated in a channel by a write voltage applied to the bottom gate of the ferroelectric read transistor, an electric field is applied to the ferroelectric material to store polarization, and the stored polarization is maintained by the ferroelectric material and the operating voltage is changed so that data is stored; and
an inversion channel is formed by an erase voltage applied to the bottom gate and the top gate, and thus an electric field is applied to the ferroelectric material so that the polarization is changed and the data erased.

* * * * *